United States Patent
Rasheed et al.

(10) Patent No.: US 11,384,432 B2
(45) Date of Patent: *Jul. 12, 2022

(54) ATOMIC LAYER DEPOSITION CHAMBER WITH FUNNEL-SHAPED GAS DISPERSION CHANNEL AND GAS DISTRIBUTION PLATE

(71) Applicant: APPLIED MATERIALS, INC., Santa Clara, CA (US)

(72) Inventors: Muhammad M. Rasheed, San Jose, CA (US); Srinivas Gandikota, Santa Clara, CA (US); Mario Dan Sanchez, San Jose, CA (US); Guoqiang Jian, San Jose, CA (US); Yixiong Yang, Santa Clara, CA (US); Deepak Jadhav, Hubli (IN); Ashutosh Agarwal, Rajasthan (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 773 days.

This patent is subject to a terminal disclaimer.

(21) Appl. No.: 14/734,838

(22) Filed: Jun. 9, 2015

(65) Prior Publication Data

US 2016/0312360 A1 Oct. 27, 2016

Related U.S. Application Data

(60) Provisional application No. 62/151,180, filed on Apr. 22, 2015.

(51) Int. Cl.
*C23C 16/455* (2006.01)
*C23C 16/44* (2006.01)
(Continued)

(52) U.S. Cl.
CPC .... *C23C 16/45544* (2013.01); *C23C 16/4405* (2013.01); *C23C 16/4408* (2013.01);
(Continued)

(58) Field of Classification Search
CPC .............. C23C 16/042; C23C 16/4405; C23C 16/4412; C23C 16/4485; C23C 16/452;
(Continued)

(56) References Cited

U.S. PATENT DOCUMENTS 3,144,035 A * 8/1964 Hablanian .............. F16J 15/006
137/1
4,229,655 A * 10/1980 Ryding ................... H01J 37/18
250/400

(Continued)

FOREIGN PATENT DOCUMENTS

| CN | 103170478 A | 6/2013 |
|----|-------------|--------|
| JP | 2005-109194 | 4/2005 |

(Continued)

OTHER PUBLICATIONS

International Search Report and Written Opinion dated Jul. 19, 2016 for PCT Application No. PCT/US2016/028253.

(Continued)

*Primary Examiner* — Jeffrie R Lund
*Assistant Examiner* — Stanislav Antolin
(74) *Attorney, Agent, or Firm* — Moser Taboada

(57) ABSTRACT

Methods and apparatus for processing a substrate are provided herein. In some embodiments, a substrate processing chamber includes: a chamber body; a chamber lid assembly having a housing enclosing a central channel that extends along a central axis and has an upper portion and a lower portion; a lid plate coupled to the housing and having a contoured bottom surface that extends downwardly and outwardly from a central opening coupled to the lower portion of the central channel to a peripheral portion of the lid plate; and a gas distribution plate disposed below the lid plate and having a plurality of apertures disposed through the gas distribution plate.

20 Claims, 5 Drawing Sheets

(51) Int. Cl.
*C23C 16/452* (2006.01)
*H01J 37/32* (2006.01)

(52) U.S. Cl.
CPC ........ *C23C 16/4412* (2013.01); *C23C 16/452* (2013.01); *C23C 16/45502* (2013.01); *C23C 16/45536* (2013.01); *C23C 16/45565* (2013.01); *C23C 16/45591* (2013.01); *H01J 37/3244* (2013.01); *H01J 37/32357* (2013.01); *H01J 37/32449* (2013.01); *H01J 37/32834* (2013.01)

(58) Field of Classification Search
CPC ........ C23C 16/45502; C23C 16/45506; C23C 16/45523–45542; C23C 16/45536; C23C 16/45544–45551; C23C 16/15553–45555; C23C 16/45563; C23C 16/45565; C23C 16/4558; C23C 16/45591; C23C 16/52; C23C 16/56; H01J 37/32357; H01J 37/3244; H01J 37/32449; H01J 37/32522; H01J 37/32862

See application file for complete search history.

(56) References Cited

U.S. PATENT DOCUMENTS

| | | | | |
|---|---|---|---|---|
| 4,854,263 | A * | 8/1989 | Chang | C23C 16/345 118/715 |
| 4,909,914 | A * | 3/1990 | Chiba | C23C 8/36 204/164 |
| 5,359,254 | A * | 10/1994 | Arkhipov | H01J 3/025 313/15 |
| 5,512,078 | A * | 4/1996 | Griffin | C03B 23/057 219/121.61 |
| 5,578,132 | A * | 11/1996 | Yamaga | C23C 16/4404 118/715 |
| 5,728,223 | A * | 3/1998 | Murakami | C23C 16/4557 118/715 |
| 5,935,337 | A * | 8/1999 | Takeuchi | C23C 16/52 118/724 |
| 5,950,925 | A * | 9/1999 | Fukunaga | C23C 16/45512 239/132.3 |
| 6,024,799 | A * | 2/2000 | Chen | C23C 16/455 118/715 |
| 6,089,698 | A * | 7/2000 | Temple | B41J 2/1623 347/47 |
| 6,302,965 | B1 * | 10/2001 | Umotoy | C23C 16/16 118/715 |
| 6,334,983 | B1 * | 1/2002 | Okayama | C23C 16/455 422/186.29 |
| 6,565,661 | B1 * | 5/2003 | Nguyen | C23C 16/45565 118/715 |
| 6,635,578 | B1 * | 10/2003 | Xu | B41J 2/1623 347/47 |
| 8,187,381 | B2 | 5/2012 | Sangam et al. | |
| 8,951,429 | B1 * | 2/2015 | Liu | H01J 37/32449 216/67 |
| 9,017,481 | B1 * | 4/2015 | Petti | H01J 37/32449 118/724 |
| 10,407,771 | B2 * | 9/2019 | Cui | H01L 21/67017 438/5 |
| 2001/0015175 | A1 * | 8/2001 | Masuda | H01J 37/32082 118/723 R |
| 2001/0035127 | A1 * | 11/2001 | Metzner | C23C 16/4405 118/715 |
| 2002/0073925 | A1 * | 6/2002 | Noble | C23C 16/52 118/724 |
| 2003/0010451 | A1 * | 1/2003 | Tzu | C23C 16/45512 156/345.33 |
| 2003/0019428 | A1 * | 1/2003 | Ku | C23C 16/455 118/715 |
| 2003/0056720 | A1 * | 3/2003 | Dauelsberg | C23C 16/45514 117/200 |
| 2003/0079686 | A1 * | 5/2003 | Chen | C23C 16/4412 118/715 |
| 2003/0082301 | A1 * | 5/2003 | Chen | C23C 16/34 427/255.28 |
| 2003/0082307 | A1 * | 5/2003 | Chung | C23C 16/34 427/402 |
| 2003/0108674 | A1 * | 6/2003 | Chung | C23C 16/34 427/255.394 |
| 2003/0116087 | A1 * | 6/2003 | Nguyen | C23C 16/4557 118/715 |
| 2003/0121608 | A1 * | 7/2003 | Chen | C23C 16/34 156/345.33 |
| 2003/0124262 | A1 * | 7/2003 | Chen | C23C 16/34 427/404 |
| 2003/0140857 | A1 * | 7/2003 | Umotoy | C23C 16/16 118/726 |
| 2003/0143841 | A1 * | 7/2003 | Yang | H01L 21/28556 438/656 |
| 2003/0172872 | A1 * | 9/2003 | Thakur | C23C 16/4412 118/715 |
| 2003/0181060 | A1 | 9/2003 | Asai et al. | |
| 2003/0205202 | A1 * | 11/2003 | Funaki | C23C 16/4404 118/723 E |
| 2003/0213560 | A1 * | 11/2003 | Wang | H01L 21/67017 156/345.31 |
| 2003/0221780 | A1 * | 12/2003 | Lei | C23C 16/45574 156/345.29 |
| 2003/0224217 | A1 * | 12/2003 | Byun | C04B 35/58007 428/698 |
| 2003/0232511 | A1 * | 12/2003 | Metzner | C23C 16/405 438/785 |
| 2004/0017049 | A1 * | 1/2004 | Fink | F16J 15/004 277/627 |
| 2004/0048461 | A1 * | 3/2004 | Chen | C23C 14/022 438/629 |
| 2004/0061447 | A1 * | 4/2004 | Saigusa | H01J 37/3255 315/111.21 |
| 2004/0069227 | A1 * | 4/2004 | Ku | C23C 16/4409 118/721 |
| 2004/0083960 | A1 * | 5/2004 | Dando | C23C 16/4409 118/715 |
| 2004/0115898 | A1 * | 6/2004 | Moghadam | C23C 16/045 438/435 |
| 2004/0129211 | A1 * | 7/2004 | Blonigan | C23C 16/45565 118/715 |
| 2004/0129217 | A1 * | 7/2004 | Strang | H01J 37/32935 118/715 |
| 2004/0144311 | A1 * | 7/2004 | Chen | C23C 16/45502 118/715 |
| 2004/0163761 | A1 * | 8/2004 | Strang | H01L 21/67017 156/345.33 |
| 2004/0166597 | A1 * | 8/2004 | Strang | H01L 21/67017 438/5 |
| 2004/0173313 | A1 * | 9/2004 | Beach | H01J 37/32532 156/345.33 |
| 2004/0187304 | A1 * | 9/2004 | Chen | C23C 16/34 29/830 |
| 2004/0206305 | A1 * | 10/2004 | Choi | C23C 16/45565 118/715 |
| 2004/0206833 | A1 * | 10/2004 | Kawazoe | F02M 61/18 239/533.12 |
| 2004/0266175 | A1 * | 12/2004 | Chen | C23C 14/022 438/629 |
| 2005/0008772 | A1 * | 1/2005 | Zhang | H01M 10/0562 427/126.1 |
| 2005/0016458 | A1 * | 1/2005 | Zhang | C23C 16/5096 118/723 R |
| 2005/0109460 | A1 * | 5/2005 | DeDontney | C23C 16/45574 156/345.33 |
| 2005/0126484 | A1 * | 6/2005 | Zhao | C23C 16/45565 118/715 |
| 2005/0139160 | A1 | 6/2005 | Lei et al. | |
| 2005/0150601 | A1 | 7/2005 | Srivastava | |
| 2005/0205110 | A1 * | 9/2005 | Kao | H01J 37/32082 134/1.1 |
| 2005/0208217 | A1 | 9/2005 | Shinriki et al. | |

(56) References Cited

U.S. PATENT DOCUMENTS

| | | | |
|---|---|---|---|
| 2005/0218115 A1* | 10/2005 | Lei | C23C 16/45563 216/59 |
| 2005/0218507 A1* | 10/2005 | Kao | H01J 37/32082 257/704 |
| 2005/0221552 A1* | 10/2005 | Kao | H01J 37/32082 438/200 |
| 2005/0230350 A1* | 10/2005 | Kao | H01J 37/32082 216/67 |
| 2005/0251990 A1* | 11/2005 | Choi | H01J 37/3244 29/558 |
| 2005/0252449 A1* | 11/2005 | Nguyen | C23C 16/0272 118/715 |
| 2005/0260347 A1* | 11/2005 | Narwankar | C23C 16/401 427/248.1 |
| 2005/0271812 A1* | 12/2005 | Myo | C23C 16/0272 427/248.1 |
| 2005/0271813 A1* | 12/2005 | Kher | C23C 16/0272 427/248.1 |
| 2006/0033678 A1* | 2/2006 | Lubomirsky | C23C 16/06 345/32 |
| 2006/0051966 A1* | 3/2006 | Or | C23C 16/5096 118/723 R |
| 2006/0137608 A1 | 6/2006 | Choi et al. | |
| 2006/0162661 A1* | 7/2006 | Jung | C23C 16/345 118/723 ER |
| 2006/0213438 A1* | 9/2006 | Ishizaka | C23C 16/4409 118/715 |
| 2006/0228496 A1* | 10/2006 | Choi | H01J 37/3244 427/569 |
| 2006/0266288 A1* | 11/2006 | Choi | C23C 16/4405 118/715 |
| 2006/0286820 A1* | 12/2006 | Singh | C23C 16/0227 438/792 |
| 2007/0087579 A1* | 4/2007 | Kitayama | C23C 16/4405 438/778 |
| 2007/0119370 A1* | 5/2007 | Ma | C23C 16/18 118/723 E |
| 2007/0119371 A1* | 5/2007 | Ma | C23C 16/18 118/723 E |
| 2007/0128862 A1* | 6/2007 | Ma | C23C 16/18 438/680 |
| 2007/0128863 A1* | 6/2007 | Ma | C23C 16/18 438/680 |
| 2007/0128864 A1* | 6/2007 | Ma | C23C 16/18 438/680 |
| 2007/0163716 A1 | 7/2007 | Hsiao et al. | |
| 2007/0181057 A1* | 8/2007 | Lam | C23C 16/0236 117/92 |
| 2007/0215048 A1* | 9/2007 | Suzuki | C23C 16/16 118/725 |
| 2007/0235137 A1* | 10/2007 | Tsukamoto | H01L 21/6875 156/345.35 |
| 2007/0281106 A1* | 12/2007 | Lubomirsky | C23C 16/401 427/569 |
| 2007/0289534 A1* | 12/2007 | Lubomirsky | C23C 16/452 118/723 R |
| 2008/0020146 A1* | 1/2008 | Choi | C23C 16/5096 427/446 |
| 2008/0078744 A1* | 4/2008 | Wang | H01J 37/00 216/67 |
| 2008/0088097 A1* | 4/2008 | Tanaka | F16J 15/06 277/650 |
| 2008/0102203 A1* | 5/2008 | Wu | C23C 16/34 427/248.1 |
| 2008/0102208 A1* | 5/2008 | Wu | C23C 16/4404 427/255.28 |
| 2008/0107809 A1* | 5/2008 | Wu | C23C 16/34 427/248.1 |
| 2008/0202416 A1* | 8/2008 | Provencher | C23C 16/45544 118/715 |
| 2008/0202425 A1* | 8/2008 | Gelatos | C23C 16/14 118/724 |
| 2008/0206987 A1* | 8/2008 | Gelatos | C23C 16/14 438/654 |
| 2008/0264337 A1* | 10/2008 | Sano | C23C 16/4408 118/704 |
| 2008/0268171 A1* | 10/2008 | Ma | C23C 16/18 427/569 |
| 2009/0017227 A1* | 1/2009 | Fu | C23C 16/0245 427/569 |
| 2009/0084317 A1* | 4/2009 | Wu | C23C 16/45544 118/728 |
| 2009/0104789 A1* | 4/2009 | Mallick | C23C 16/045 438/788 |
| 2009/0133835 A1* | 5/2009 | Nishimoto | C23C 16/46 156/345.27 |
| 2009/0156015 A1* | 6/2009 | Park | C23C 16/45519 438/758 |
| 2009/0183832 A1* | 7/2009 | Nakagawa | H01J 37/32431 156/345.1 |
| 2009/0221151 A1* | 9/2009 | Honda | H01J 37/3244 438/729 |
| 2009/0255324 A1* | 10/2009 | Ishibashi | H01L 21/67069 73/31.04 |
| 2009/0291563 A1* | 11/2009 | Ishibashi | C23C 16/54 438/710 |
| 2009/0314309 A1* | 12/2009 | Sankarakrishnan | C23C 16/4409 134/1.1 |
| 2009/0325386 A1* | 12/2009 | Devine | C23C 16/45557 438/706 |
| 2010/0003406 A1* | 1/2010 | Lam | C23C 16/4412 427/255.391 |
| 2010/0021631 A1* | 1/2010 | Moriyama | C23C 16/4412 427/255.23 |
| 2010/0068891 A1* | 3/2010 | Hatanaka | H01L 21/76843 438/758 |
| 2010/0180819 A1* | 7/2010 | Hatanaka | C23C 16/45574 118/719 |
| 2010/0183825 A1* | 7/2010 | Becker | C23C 16/4404 427/569 |
| 2010/0310772 A1* | 12/2010 | Tsuda | C23C 16/409 427/255.28 |
| 2010/0317198 A1* | 12/2010 | Antonelli | H01L 21/0206 438/758 |
| 2011/0034035 A1* | 2/2011 | Liang | C23C 16/401 438/761 |
| 2011/0057393 A1* | 3/2011 | van den Boom | F16J 15/40 277/312 |
| 2011/0073038 A1 | 3/2011 | Chien et al. | |
| 2011/0081782 A1* | 4/2011 | Liang | C23C 16/345 438/697 |
| 2011/0098841 A1 | 4/2011 | Tsuda | |
| 2011/0115378 A1* | 5/2011 | Lubomirsky | H01J 37/32357 315/111.21 |
| 2011/0136346 A1* | 6/2011 | Geissbuhler | H01J 37/32357 438/710 |
| 2011/0151677 A1* | 6/2011 | Wang | H01L 21/02326 438/773 |
| 2011/0223334 A1* | 9/2011 | Yudovsky | C23C 16/45504 427/255.23 |
| 2011/0303146 A1* | 12/2011 | Nishijima | H01J 37/32412 118/708 |
| 2012/0027918 A1* | 2/2012 | Tiner | C23C 16/45565 427/58 |
| 2012/0211462 A1* | 8/2012 | Zhang | H01L 21/31116 216/13 |
| 2012/0220116 A1* | 8/2012 | Noori | H01J 37/3244 29/558 |
| 2012/0238103 A1* | 9/2012 | Zhang | H01J 37/32422 438/720 |
| 2013/0025787 A1* | 1/2013 | Yang | H01J 37/32633 156/345.29 |
| 2013/0034968 A1* | 2/2013 | Zhang | H01L 21/31116 438/718 |
| 2013/0045605 A1* | 2/2013 | Wang | H01L 21/3065 438/723 |

(56) References Cited

U.S. PATENT DOCUMENTS

| | | | | |
|---|---|---|---|---|
| 2013/0052827 A1* | 2/2013 | Wang | ................ | H01J 37/32357 438/694 |
| 2013/0059440 A1* | 3/2013 | Wang | ................ | H01L 21/3065 438/694 |
| 2013/0089988 A1* | 4/2013 | Wang | ................ | H01J 37/32357 438/719 |
| 2013/0189840 A1* | 7/2013 | Fu | ................ | C23C 16/0236 438/680 |
| 2013/0260555 A1* | 10/2013 | Zope | ................ | H01L 21/4846 438/660 |
| 2013/0295297 A1* | 11/2013 | Chou | ................ | C23C 16/45565 427/569 |
| 2014/0097270 A1* | 4/2014 | Liang | ................ | B05B 1/18 239/132.3 |
| 2014/0103145 A1* | 4/2014 | White | ................ | C23C 16/45565 239/548 |
| 2014/0120723 A1* | 5/2014 | Fu | ................ | H01L 21/28506 438/680 |
| 2014/0261802 A1* | 9/2014 | Chen | ................ | H01J 37/32816 137/565.23 |
| 2015/0093916 A1 | 4/2015 | Yamamoto et al. | | |
| 2015/0187568 A1* | 7/2015 | Petti | ................ | H01L 21/28556 438/656 |
| 2015/0270119 A1* | 9/2015 | Yahata | ................ | C23C 16/4405 438/758 |
| 2015/0380220 A1* | 12/2015 | Tan | ................ | H01J 37/3244 427/569 |
| 2016/0032457 A1* | 2/2016 | Tanabe | ................ | C23C 16/4585 118/666 |
| 2016/0097119 A1* | 4/2016 | Cui | ................ | C23C 16/5096 427/446 |
| 2016/0230280 A1* | 8/2016 | Matsui | ................ | C23C 16/45512 156/345.33 |
| 2016/0312360 A1* | 10/2016 | Rasheed | ................ | H01J 37/3244 |
| 2019/0048467 A1* | 2/2019 | Sanchez | ................ | C23C 16/4557 118/715 |

FOREIGN PATENT DOCUMENTS

| | | | | |
|---|---|---|---|---|
| JP | 5764228 B1 | * | 8/2015 | ........ H01J 37/32449 |
| JP | 2015178644 A | * | 10/2015 | ......... C23C 16/4405 |

OTHER PUBLICATIONS

Extended European Search Report dated Dec. 21, 2018 received for EP Application No. 16 79 3678.

Chinese Search Report for Application No. 2016800227667 dated May 28, 2019.

* cited by examiner

ATOMIC LAYER DEPOSITION CHAMBER WITH FUNNEL-SHAPED GAS DISPERSION CHANNEL AND GAS DISTRIBUTION PLATE

CROSS-REFERENCE TO RELATED APPLICATIONS

This application claims benefit of U.S. provisional patent application Ser. No. 62/151,180, filed Apr. 22, 2015, which is herein incorporated by reference in its entirety.

FIELD

Embodiments of the disclosure generally relate to apparatus and methods for atomic layer deposition.

BACKGROUND

Reliably producing submicron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of VLSI and ULSI technology use precise processing of high aspect ratio features, such as vias and other interconnects. Reliable formation of these interconnects is very important to VLSI and ULSI success and to the continued effort to increase circuit density and quality of individual substrates.

As circuit densities increase, the widths of interconnects, such as vias, trenches, contacts, and other features, as well as the dielectric materials between, decrease while the thickness of the dielectric layers remain substantially constant, resulting in increased height-to-width aspect ratios of the features. Many traditional deposition processes have difficulty filling submicron structures where the aspect ratio exceeds 4:1, and particularly where the aspect ratio exceeds 10:1. Therefore, there is a great amount of ongoing effort being directed at the formation of substantially void-free and seam-free submicron features having high aspect ratios.

Atomic layer deposition (ALD) is a deposition technique being explored for the deposition of material layers over features having high aspect ratios. One example of an ALD process includes the sequential introduction of pulses of gases. For instance, one cycle for the sequential introduction of pulses of gases may contain a pulse of a first reactant gas, followed by a pulse of a purge gas and/or a pump evacuation, followed by a pulse of a second reactant gas, and followed by a pulse of a purge gas and/or a pump evacuation. The term "gas" as used herein is defined to include a single gas or a plurality of gases. Sequential introduction of separate pulses of the first reactant and the second reactant may result in the alternating self-limiting absorption of monolayers of the reactants on the surface of the substrate and, thus, forms a monolayer of material for each cycle. The cycle may be repeated to a desired thickness of the deposited material. A pulse of a purge gas and/or a pump evacuation between the pulses of the first reactant gas and the pulses of the second reactant gas serves to reduce the likelihood of gas phase reactions of the reactants due to excess amounts of the reactants remaining in the chamber.

In some chamber designs for ALD processing, precursors and gases are delivered using a funnel lid through which precursor is distributed through multiple injectors above a funnel shaped lid. The injectors generate a circular motion of the injected gas which distributes through the funnel profile at the center of the lid. The rotational inertia of the gas/ALD precursor molecules distributes the molecules from center to edge resulting in improved uniformity deposition. However, in some applications, the inventors have observed a donut-shaped deposition profile near the center of the substrate being processed. The donut-shaped deposition profile is believed to be caused by the funnel shape of the lid and can lead to integration issues for customers.

Therefore, the inventors have provided improved apparatus and methods for ALD processing of a substrate.

SUMMARY

Methods and apparatus for processing a substrate are provided herein. In some embodiments, a substrate processing chamber includes: a chamber body; a chamber lid assembly having a housing enclosing a central channel that extends along a central axis and has an upper portion and a lower portion; a lid plate coupled to the housing and having a contoured bottom surface that extends downwardly and outwardly from a central opening coupled to the lower portion of the central channel to a peripheral portion of the lid plate; and a gas distribution plate disposed below the lid plate and having a plurality of apertures disposed through the gas distribution plate.

In some embodiments, a substrate processing chamber includes: a chamber body; a chamber lid assembly having a housing enclosing a central channel that extends along a central axis and has an upper portion and a lower portion; a lid plate coupled to the housing and having a contoured bottom surface that extends downwardly and outwardly from a central opening coupled to the lower portion of the central channel to a peripheral portion of the lid plate; a gas distribution plate disposed below the lid plate and having a plurality of apertures disposed through the gas distribution plate; a remote plasma source fluidly coupled to the central channel; an isolation collar coupled between the remote plasma source and the housing, wherein the isolation collar has an inner channel extending through the isolation collar to fluidly couple the remote plasma source and the central channel; an exhaust conduit coupled to the isolation collar at a first end and to a main pumping channel at a second end; and a valve coupled to the exhaust conduit to selectively open or close the exhaust conduit.

In some embodiments, a method of processing a substrate includes: flowing a first process gas into a gas dispersion channel and a reaction zone of a process chamber; flowing the first process gas through a plurality of apertures in a gas distribution plate disposed in the reaction zone and onto the substrate; flowing a cleaning gas into the gas dispersion channel and the reaction zone; exhausting the cleaning gas via an exhaust system; flowing a second process gas into the gas dispersion channel and the reaction zone; flowing the second process gas through the plurality of apertures in the gas distribution plate and onto the substrate; flowing the cleaning gas into the gas dispersion channel and the reaction zone; and exhausting the cleaning gas via the exhaust system.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, that the appended drawings illustrate only typical embodiments of the disclosure and are therefore not to be considered limiting of scope, for the disclosure may admit to other equally effective embodiments.

Figure 1:
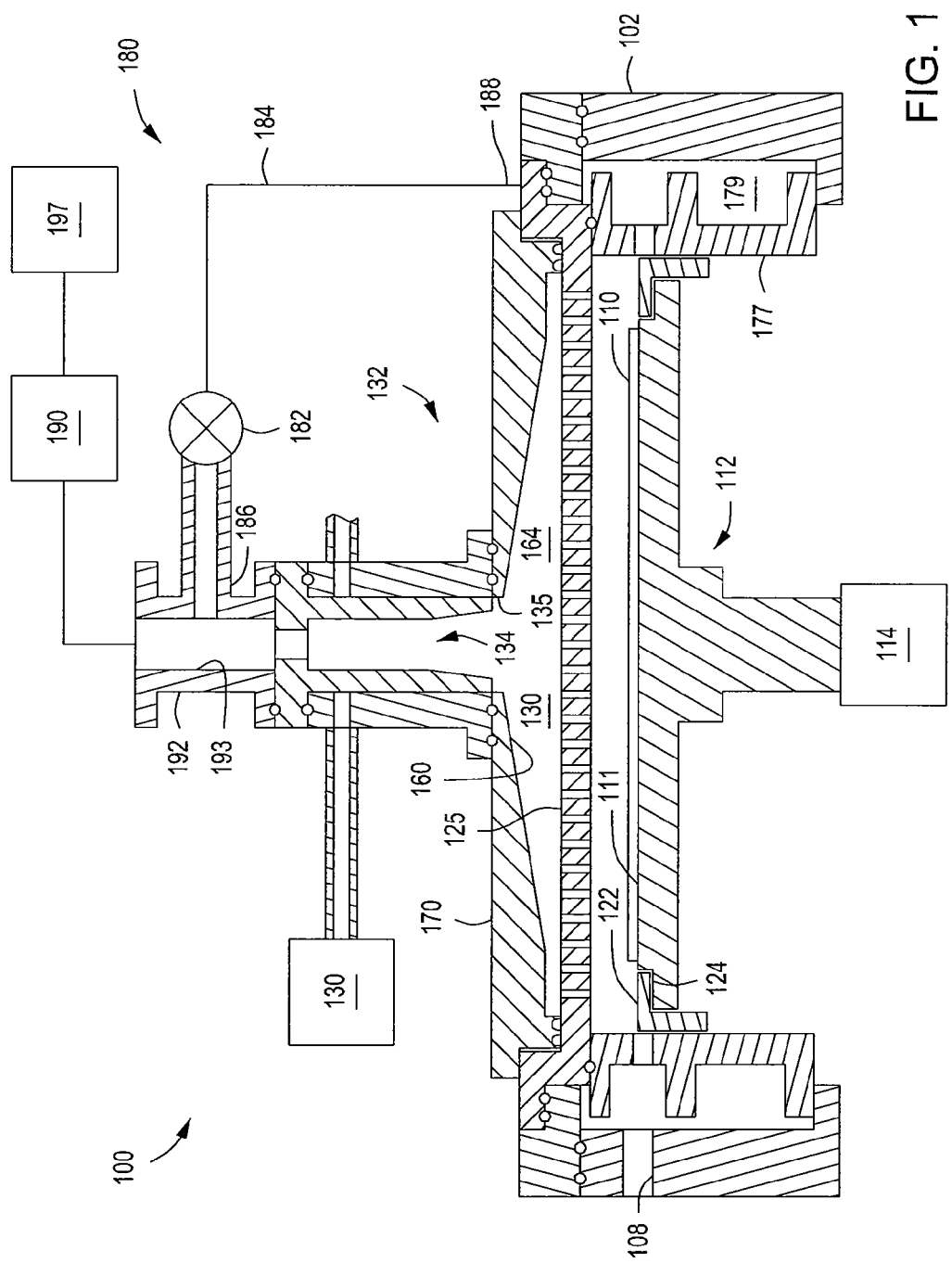
FIG. 1 depicts a schematic view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide apparatus and methods that may be used to clean substrate processing chambers, such as an atomic layer deposition (ALD) chamber, and to deposit materials during, for example, an ALD process. Embodiments include substrate processing chambers and gas delivery systems which include a remote plasma source and a gas distribution plate. Other embodiments provide methods for depositing materials using these gas delivery systems during ALD processes. Examples of suitable processing chambers for incorporation of the apparatuses described herein include high dielectric constant (i.e., high k) and metal ALD deposition chambers available from Applied Materials, Inc., of Santa Clara, Calif. The following process chamber description is provided for context and exemplary purposes, and should not be interpreted or construed as limiting the scope of the disclosure.

Figure 2:
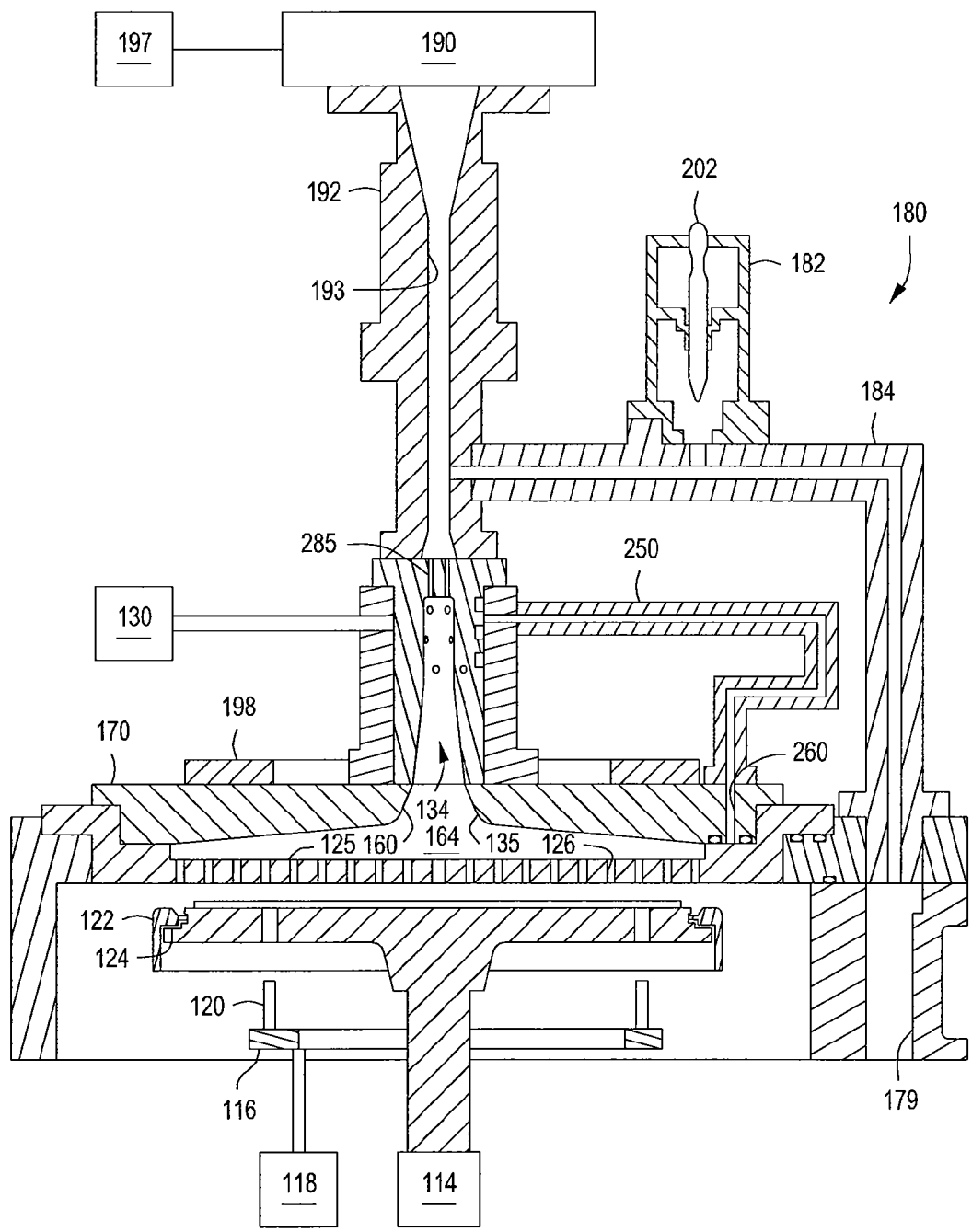
FIG. 2 depicts a schematic cross-sectional view of a process chamber in accordance with some embodiments of the present disclosure.

FIG. 1 is a schematic view of a substrate processing chamber (process chamber 100) including a gas delivery system 130 adapted for ALD processes in accordance with some embodiments of the present disclosure. FIG. 2 is a cross-sectional view of the process chamber 100. Process chamber 100 includes a chamber body 102 having a processing volume within the chamber body 102 and beneath the chamber lid assembly 132. Slit valve 108 in the process chamber 100 provides access for a robot (not shown) to deliver and retrieve a substrate 110, such as a 200 mm or 300 mm semiconductor wafer or a glass substrate, to and from the process chamber 100. A chamber liner 177 is disposed along the walls of the process chamber 100 to protect the chamber from corrosive gases used during processing/cleaning.

A substrate support 112 supports the substrate 110 on a substrate receiving surface 111 in the process chamber 100. The substrate support 112 is mounted to a lift motor 114 for raising and lowering the substrate support 112 and the substrate 110 disposed on the substrate support. A lift plate 116 (shown in FIG. 2), connected to a lift motor 118, is mounted in the process chamber 100 to raise and lower lift pins 120 movably disposed through the substrate support 112. The lift pins 120 raise and lower the substrate 110 over the surface of the substrate support 112. The substrate support 112 may include a vacuum chuck (not shown), an electrostatic chuck (not shown), or a clamp ring (not shown) for securing the substrate 110 to the substrate support 112 during a deposition process.

The temperature of the substrate support 112 may be adjusted to control the temperature of the substrate 110. For example, substrate support 112 may be heated using an embedded heating element, such as a resistive heater (not shown), or may be heated using radiant heat, such as heating lamps (not shown) disposed above the substrate support 112. A purge ring 122 may be disposed on the substrate support 112 to define a purge channel 124 which provides a purge gas to a peripheral portion of the substrate 110 to prevent deposition on the peripheral portion of the substrate 110.

Gas delivery system 130 is disposed at an upper portion of the chamber body 102 to provide a gas, such as a process gas and/or a purge gas, to process chamber 100. A vacuum system (not shown) is in communication with a pumping channel 179 to evacuate any desired gases from the process chamber 100 and to help maintain a desired pressure or pressure range inside the process chamber 100.

In some embodiments, the chamber lid assembly 132 includes a gas dispersion channel 134 extending through a central portion of the chamber lid assembly 132. As shown in FIGS. 1 and 2, the gas dispersion channel 134 extends perpendicularly toward the substrate receiving surface 111 and also extends along a central axis 133 of the gas dispersion channel 134, through lid plate 170, and to lower surface 160. In some embodiments, an upper portion of the gas dispersion channel 134 is substantially cylindrical along central axis 133 and a lower portion of the gas dispersion channel 134 tapers away from central axis 133. The lower surface 160 is sized and shaped to substantially cover the substrate 110 disposed on the substrate receiving surface 111 of the substrate support 112. The lower surface 160 tapers from an outer edge of the lid plate 170 towards the gas dispersion channel 134. The gas delivery system 130 may provide one or more gasses to the gas dispersion channel 134 to process the substrate 110. In some embodiments, the gas delivery system 130 may be coupled to the gas dispersion channel 134 via one gas inlet. In some embodiments, such as that shown in FIG. 3, the gas delivery system may be coupled to the gas dispersion channel 134 via a plurality of inlets.

Figure 3:
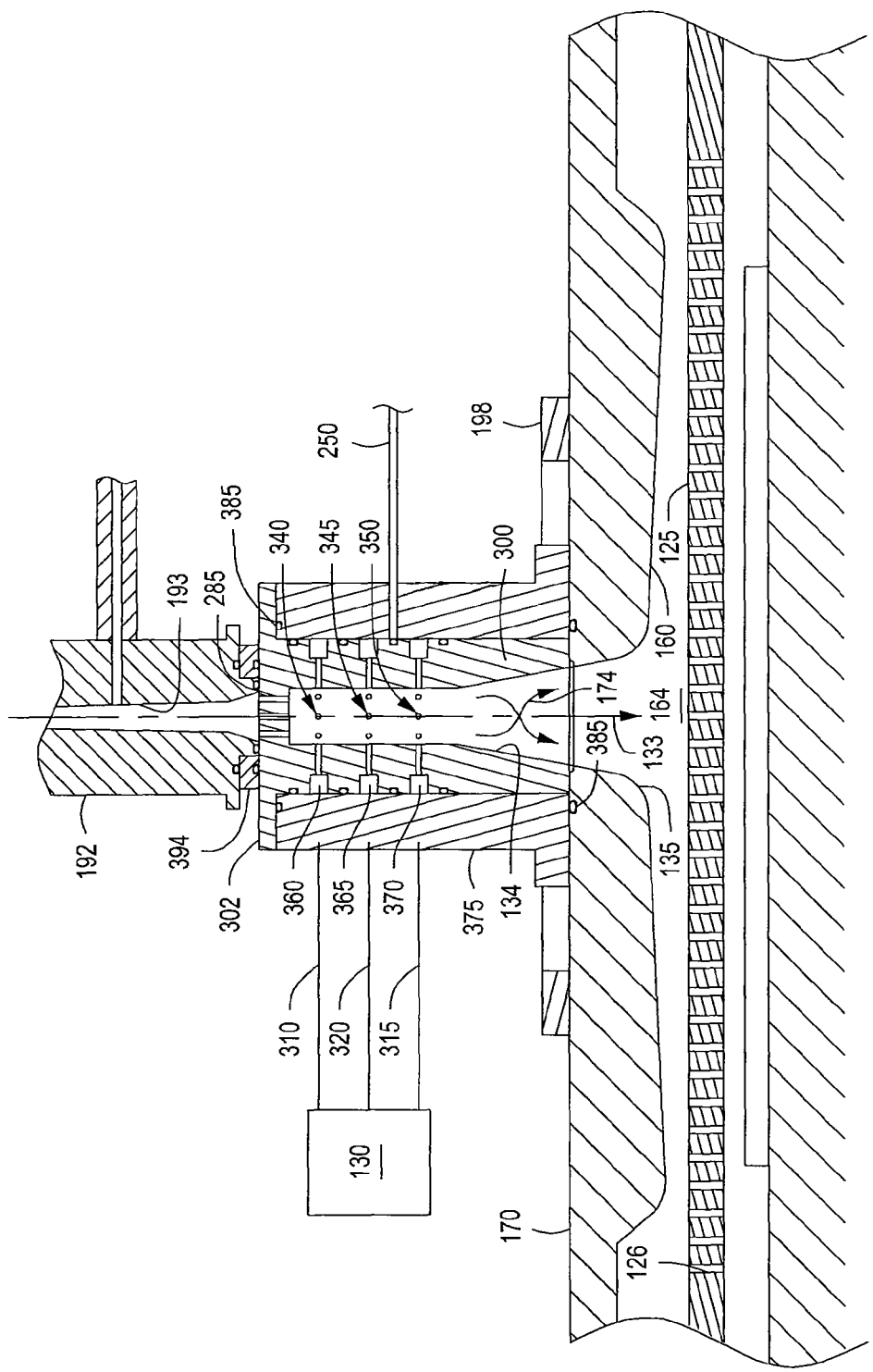
FIG. 3 depicts a schematic cross-sectional view of a lid assembly in accordance with some embodiments of the present disclosure.

As illustrated in FIG. 3, circular gas flow 174, which illustrates the flow of process gases through the gas dispersion channel 134, may contain various types of flow patterns. In some embodiments, processing gases may be forced to make revolutions around central axis 133 of gas dispersion channel 134 while passing through the dispersion channel. In such embodiments, the circular gas flow 174 may contain various types of circular flow patterns, such as a vortex pattern, a helix pattern, a spiral pattern, or derivatives thereof.

Although providing a circular gas flow 174 is beneficial for many applications, the inventors have discovered that in some applications, the circular gas flow can lead to non-uniform processing results. The inventors have observed the gas flow may lead to a donut-shaped deposition profile near a center of the substrate 110 being processed. The donut-shaped profile may be caused by the funnel shape of gas dispersion channel 134. Therefore, in some embodiments, the process chamber 100 further includes a gas distribution plate 125 having a plurality of apertures 126 disposed through the gas distribution plate 125. The gas distribution plate 125 extends to the surface of the gas dispersion channel 134 such that the only pathway from the gas dispersion channel 134 to the substrate is through the plurality of apertures 126 of the gas distribution plate 125. The gas distribution plate 125 advantageously creates a choked flow of gas through the gas distribution plate 125 resulting in a more uniform deposition on the substrate 110 and, thus, substantially eliminating the donut-shaped deposition caused by the rotational flow of gas.

In some embodiments, the gas distribution plate 125 is formed of a non-corrosive ceramic material such as, for example, aluminum oxide or aluminum nitride. In some embodiments, each of the plurality of apertures 126 may have an equivalent fluid conductance. In some embodiments, a density of the plurality of apertures 126 (e.g., the number of apertures or the size of the openings of the apertures per unit area) may vary across the gas distribution plate 125 to achieve a desired deposition profile on the substrate 110. For example, a higher density of apertures 126 may be disposed at a center of the gas distribution plate 125 to increase the deposition rate at the center of the substrate relative to the edge of the substrate to further improve deposition uniformity.

Figure 4A:
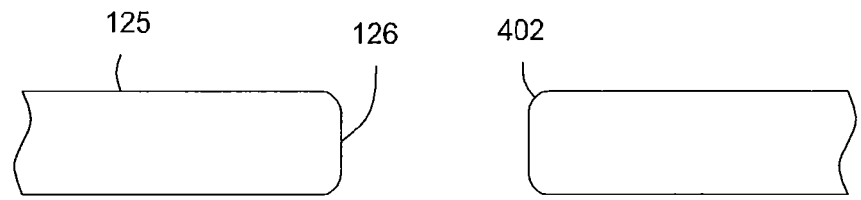
FIGS. 4A-C depict schematic views of apertures disposed through a gas distribution plate in accordance with embodiments of the present disclosure.
Figure 4B:
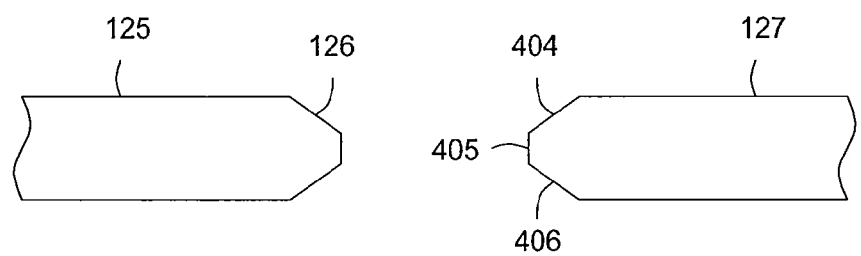
Figure 4C:
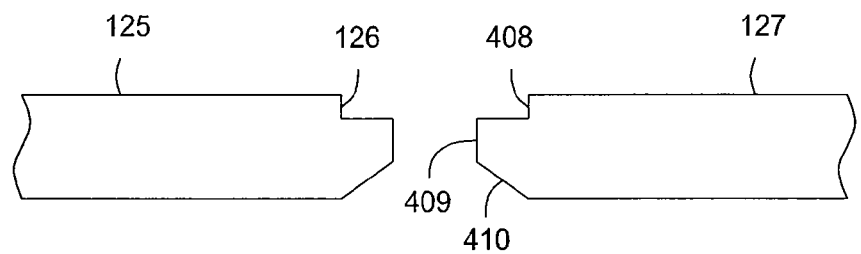

Although the plurality of apertures 126 are depicted as cylindrical through holes, the plurality of apertures 126 may have different profiles. FIGS. 4A-C depict different non-limiting embodiments of profiles of the plurality of apertures 126. In the embodiment depicted in FIG. 4A, the aperture 126 is a cylindrical through hole having curved edges 402 that surround the aperture. In the embodiment depicted in FIG. 4B, the aperture 126 is a through hole having an upper portion 404 that tapers inwardly toward a center of the aperture, a cylindrical center portion 405 extending perpendicularly to an upper surface 127 of the gas distribution plate 125, and a lower portion 406 that tapers outwardly from the center of the aperture. In the embodiment depicted in FIG. 4C, the aperture 126 is a through hole having an upper portion 408 having a countersunk hole, a cylindrical center portion 409 extending perpendicularly to the upper surface 127 of the gas distribution plate 125, and a lower portion 410 that tapers outwardly from the center of the aperture. Other profiles of the plurality of apertures 126 may alternatively be used to achieve optimal deposition uniformity during processing of the substrate 110.

Not wishing to be bound by theory, the inventors believe that the diameter of gas dispersion channel 134, which is constant from the upper portion of gas dispersion channel 134 to a first point along central axis 133 and increasing from the first point to lower portion 135 of gas dispersion channel 134, allows less of an adiabatic expansion of a gas through gas dispersion channel 134 which helps to control the temperature of the process gas contained in the circular gas flow 174. For example, a sudden adiabatic expansion of a gas delivered into gas dispersion channel 134 may result in a drop in the temperature of the gas which may cause condensation of the gas and formation of droplets. On the other hand, a gas dispersion channel 134 that gradually tapers is believed to provide less of an adiabatic expansion of a gas. Therefore, more heat may be transferred to or from the gas, and, thus, the temperature of the gas may be more easily controlled by controlling the temperature of chamber lid assembly 132. Gas dispersion channel 134 may gradually taper and contain one or more tapered inner surfaces, such as a tapered straight surface, a concave surface, a convex surface, or combinations thereof or may contain sections of one or more tapered inner surfaces (i.e., a portion tapered and a portion non-tapered).

As shown in FIG. 3, the upper portion of the gas dispersion channel 134 is defined by an insert 300 disposed in an inner region of a housing 375. The insert 300 includes a cap 302 at an upper portion of the insert 300 and a central passageway that at least partially defines the gas dispersion channel 134. The cap 302 extends over the housing 375 to hold the insert 300 in place. The insert 300 and cap 302 include a plurality of o-rings 385 disposed between the insert 300 and the housing 375 to ensure proper sealing. The insert 300 includes a plurality of circumferential apertures which, when the insert 300 is inserted into the housing 375, form a corresponding plurality of circumferential channels 360, 365, 370. The plurality of circumferential channels 360, 365, 370 are fluidly coupled to the gas dispersion channel 134 via a corresponding plurality of holes 340, 345, 350. In the embodiment shown in FIG. 3, the gas delivery system 130 is coupled to the gas dispersion channel 134 via a plurality of gas feed lines 310, 315, 320. The gas feed lines gas feed lines 310, 315, 320 are fluidly coupled to the plurality of circumferential channels 360, 365, 370 to provide one or more gases to the gas dispersion channel 134.

Returning to FIGS. 1 and 2, the process chamber 100 further includes a chamber cleaning system including a remote plasma source (RPS) 190, an isolation collar 192 coupled to the RPS 190 at one end and the cap 302 at an opposite end, a heater plate 198 coupled to an upper surface of the lid plate 170, and a cleaning gas (i.e., purge gas) source 197 fluidly coupled to the RPS 190. The cleaning gas source may include any gas suitable for forming a plasma to clean the process chamber 100. In some embodiments, for example, the cleaning gas may be nitrogen trifluoride ($NF_3$). The isolation collar 192 includes an inner channel 193 that is fluidly coupled to the gas dispersion channel 134 through a plurality of holes 285 disposed in a central portion of the cap 302 to flow a plasma from the RPS 190 through the gas dispersion channel 134 and into the reaction zone 164. The heater plate 198 may be formed of stainless steel and include a plurality of resistive heating elements dispersed throughout the plate.

Typically, a cleaning gas is flowed through the gas dispersion channel 134 and the reaction zone 164 after a first gas is provided to the gas dispersion channel 134 by the gas delivery system 130 to quickly purge the first gas from the gas dispersion channel 134 and the reaction zone 164. Subsequently, a second gas is provided by the gas delivery system 130 to the gas dispersion channel 134 and the cleaning gas is again flowed through the gas dispersion channel 134 to the reaction zone 164 to quickly purge the second gas from the gas dispersion channel 134 and the reaction zone 164. However, the addition of the gas distribution plate 125 chokes the flow of the cleaning gas to the pumping channel 179 and prolongs the cleaning process. As such, the inventors have incorporated an exhaust system 180 having an exhaust conduit 184 coupled to the isolation collar 192 at a first end 186 and to the pumping channel 179 at a second end 188. A valve 182 is disposed in the exhaust conduit 184 to selectively fluidly couple the exhaust conduit 184 to the inner channel 193. In some embodiments, for example, the valve 182 may be a plunger type valve having a plunger 202 that is moveable between a first position (shown in FIG. 2) to fluidly couple the exhaust conduit 184 to the inner channel 193 and a second position to seal off the exhaust conduit 184 from the inner channel 193. Each time the cleaning gas is flowed through the gas dispersion channel 134 and the reaction zone 164, the valve 182 is opened and the cleaning gas is rapidly exhausted to the pumping channel 179.

When a pressure inside of the process chamber 100 exceeds a pressure inside of the RPS 190, processing gasses may flow up to and damage the RPS 190. The plurality of holes 285 serve as a choke point to prevent a backflow of processing gases from flowing up through the inner channel 193 and into the RPS 190. The isolation collar 192 may be formed of any material that is non-reactive with the cleaning gas being used. In some embodiments, the isolation collar 192 may be formed of aluminum when the cleaning gas is $NF_3$. In some embodiments, the isolation collar 192 and the insert 300 may be formed of aluminum and coated with a coating to prevent corrosion of the isolation collar 192 and the insert 300 from corrosive gases when used. For example, the coating may be formed of nickel or aluminum oxide.

Referring to FIG. 3, the RPS 190 operates at a temperature less than or equal to about 40° C. In order advantageously insulate the RPS 190 from heat generated in the process chamber 100, a thermal isolation ring 394 is disposed between the isolation collar 192 and the cap 302. The thermal isolation ring 394 is formed of a metal with low thermal conductivity (e.g., lower than the thermal conductivity of the isolation collar 192 and the cap 302). In addition, an o-ring 385 may also be disposed between the isolation collar 192 and the cap 302 to further reduce the contact area between the isolation collar 192 and the cap 302. The combination of the thermal isolation ring 394 and the o-ring 385 acts as a thermal choke to ensure that the heat generated in the process chamber 100 does not adversely affect the RPS 190.

In some embodiments, when the lid plate 170 is heated above 100° C. the process chamber 100 may include a differential pumping line 250 to ensure that any process gases or byproducts trapped between o-rings 385 are exhausted to the pumping channel 179. The differential pumping line 250 is coupled to the lid plate 170 at a first end and to the insert 300 at a second end opposite the first end. The differential pumping line is fluidly coupled to the gas dispersion channel 134 and to one or more channels 260 formed at areas between two or more o-rings 385. When the valve 182 is opened to exhaust the gas dispersion channel 134, the differential pumping line exhausts gases trapped between o-rings 385.

Returning to FIG. 3, a portion of lower surface 160 of chamber lid assembly 132 may be contoured or angled downwardly and outwardly from a central opening coupled to the gas dispersion channel 134 to a peripheral portion of chamber lid assembly 132 to help provide an improved velocity profile of a gas flow from gas dispersion channel 134 across the surface of substrate 110 (i.e., from the center of the substrate to the edge of the substrate). Lower surface 160 may contain one or more surfaces, such as a straight surface, a concave surface, a convex surface, or combinations thereof. In one embodiment, lower surface 160 is convexly funnel-shaped.

In one example, lower surface 160 is downwardly and outwardly sloping toward an edge of the substrate receiving surface 111 to help reduce the variation in the velocity of the process gases traveling between lower surface 160 of chamber lid assembly 132 and substrate 110 while assisting to provide uniform exposure of the surface of substrate 110 to a reactant gas. The components and parts of chamber lid assembly 132 may contain materials such as stainless steel, aluminum, nickel-plated aluminum, nickel, alloys thereof, or other suitable materials. In one embodiment, lid plate 170 may be independently fabricated, machined, forged, or otherwise made from a metal, such as aluminum, an aluminum alloy, steel, stainless steel, alloys thereof, or combinations thereof.

In some embodiments, inner surface 131 of gas dispersion channel 134 and lower surface 160 of chamber lid assembly 132 may contain a mirror polished surface to help a flow of a gas along gas dispersion channel 134 and lower surface 160 of chamber lid assembly 132.

Referring to FIGS. 1-3, in a processing operation, substrate 110 is delivered to process chamber 100 through slit valve 108 by a robot (not shown). Substrate 110 is positioned on substrate support 112 through cooperation of lift pins 120 and the robot. Substrate support 112 raises substrate 110 into close opposition to a lower surface of the gas distribution plate 125. A first gas flow may be injected into gas dispersion channel 134 of process chamber 100 by the gas delivery system 130 together or separately (i.e., pulses) with a second gas flow. The first gas flow may contain a continuous flow of a purge gas from a purge gas source and pulses of a reactant gas from a reactant gas source or may contain pulses of a reactant gas from the reactant gas source and pulses of a purge gas from the purge gas source. The second gas flow may contain a continuous flow of a purge gas from a purge gas source and pulses of a reactant gas from a reactant gas source or may contain pulses of a reactant gas from a reactant gas source and pulses of a purge gas from a purge gas source.

The circular gas flow 174 travels through gas dispersion channel 134 and subsequently through the plurality of apertures 126 in the gas distribution plate 125. The gas is then deposited on the surface of substrate 110. Lower surface 160 of chamber lid assembly 132, which is downwardly sloping, helps reduce the variation of the velocity of the gas flow across the surface of gas distribution plate 125. Excess gas, by-products, etc. flow into the pumping channel 179 and are then exhausted from process chamber 100. Throughout the processing operation, the heater plate 198 may heat the chamber lid assembly 132 to a predetermined temperature to heat any solid byproducts that have accumulated on walls of the process chamber 100 (or a processing kit disposed in the chamber). As a result, any accumulated solid byproducts are vaporized. The vaporized byproducts are evacuated by a vacuum system (not shown) and pumping channel 179. In some embodiments, the predetermined temperature is greater than or equal to 150° C.

Figure 5:
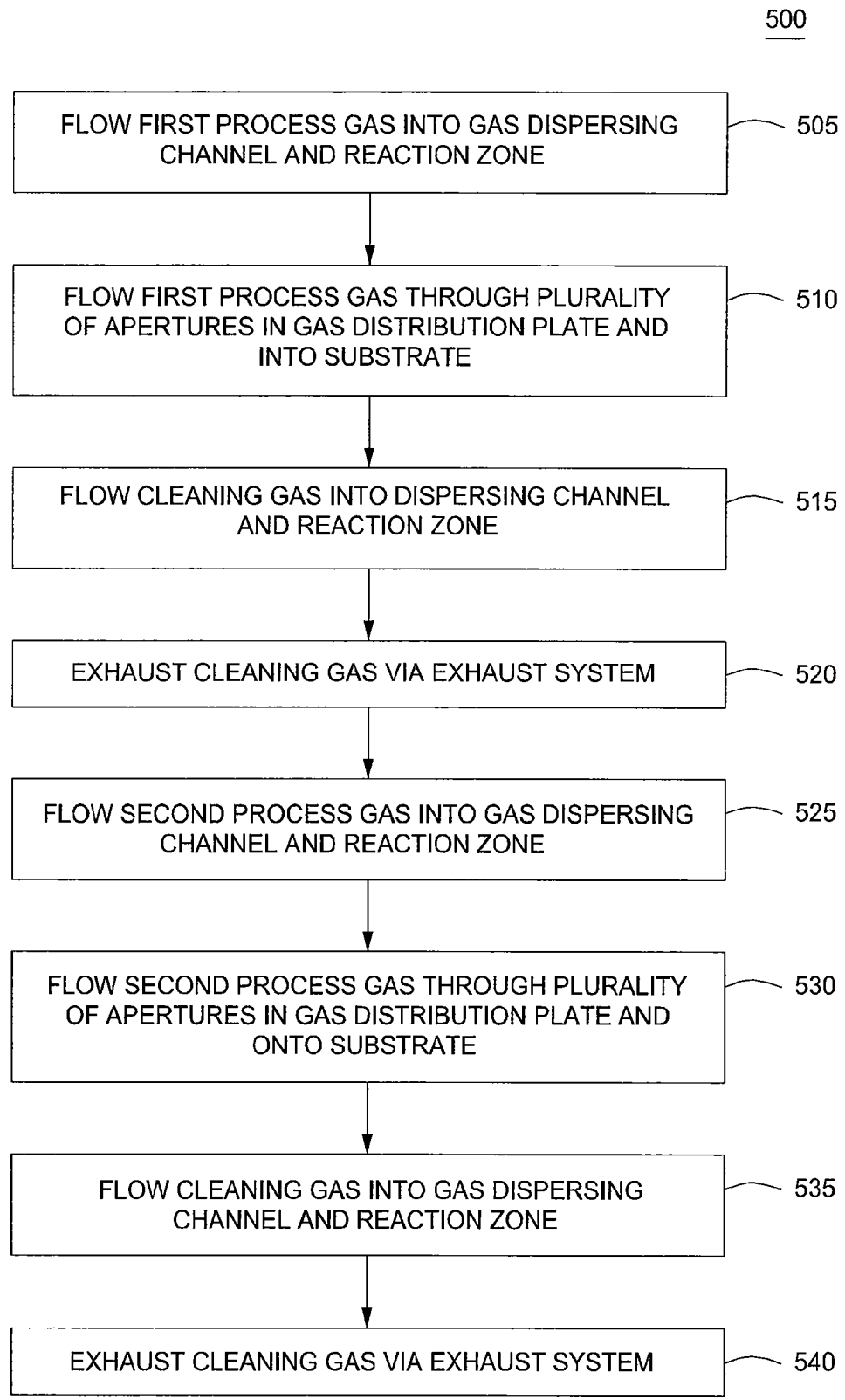
FIG. 5 depicts a flowchart illustrating a method of processing a substrate in accordance to some embodiments of the present disclosure.

FIG. 5 illustrates a method 500 of processing a substrate in accordance with some embodiments of the present disclosure. At 505, a first process gas is flowed from the gas delivery system 130 into the gas dispersion channel 134 and the reaction zone 164. At 510, the first process gas is flowed through the plurality of apertures 126 in the gas distribution plate 125 and onto the substrate 110. At 515, a cleaning gas is flowed into the gas dispersion channel 134 and the reaction zone 164 to purge the first process gas. At 520, the cleaning gas is exhausted via the exhaust system 180. At 525 a second process gas is flowed into the gas dispersion channel 134 and the reaction zone 164. At 530, the second process gas is flowed through the plurality of apertures 126 in the gas distribution plate 125 and onto the substrate 110. At 535, the cleaning gas is flowed into the gas dispersion channel 134 and the reaction zone 164 to purge the second process gas. At 540, the cleaning gas is exhausted via the exhaust system 180.

Other embodiments of a chamber adapted for atomic layer deposition incorporate one or more of these features.

While the foregoing is directed to some embodiments of the present disclosure, other and further embodiments may be devised without departing from the basic scope thereof.

What is claimed is:

1. A substrate processing chamber, comprising:
a chamber body;
a chamber lid assembly having a housing enclosing a central channel that extends along a central axis and has an upper portion and a lower portion;
a lid plate coupled to the housing and having a contoured bottom surface that extends downwardly and outwardly from a central opening coupled to the lower portion of the central channel to a peripheral portion of the lid plate, the lid plate having one or more channels formed through the lid plate from a top surface of the lid plate to the contoured bottom surface;
a gas distribution plate disposed below the lid plate and having a plurality of apertures disposed through the gas distribution plate; and
an isolation collar coupled to the housing and having an inner channel extending through the isolation collar, wherein the inner channel of the isolation collar is fluidly coupled to the central channel of the lid plate through a plurality of holes;
wherein the contoured bottom surface of the lid plate extends to and contacts the gas distribution plate.

2. The substrate processing chamber of claim 1, further comprising:
a remote plasma source fluidly coupled to the central channel; and
wherein the inner channel extending through the isolation collar fluidly couples the remote plasma source and the central channel.

3. The substrate processing chamber of claim 2, further comprising:
an exhaust conduit coupled to the isolation collar at a first end and to a main pumping channel at a second end; and
a valve coupled to the exhaust conduit to selectively open or close the exhaust conduit.

4. The substrate processing chamber of claim 1, wherein the housing includes an inner region; and further comprising:
an insert disposed in the inner region and having a central passageway that at least partially defines the central channel.

5. The substrate processing chamber of claim 4, further comprising:
a differential pumping line coupled to the insert at a first end and to the one or more channels formed through the lid plate at a second end,
wherein the one or more channels formed through the lid plate are disposed in an area of the lid plate between two or more o-rings to exhaust gases trapped between the o-rings.

6. The substrate processing chamber of claim 1, further comprising:
a heater plate coupled to an upper surface of the lid plate to heat the lid plate to a predetermined temperature.

7. The substrate processing chamber of claim 1, wherein a density of the plurality of apertures varies across the gas distribution plate.

8. The substrate processing chamber of claim 1, wherein the plurality of apertures have an equivalent fluid conductance.

9. The substrate processing chamber of claim 1, wherein the gas distribution plate is formed of a non-corrosive ceramic material.

10. The substrate processing chamber of claim 1, wherein a lower surface of the chamber lid assembly is downwardly sloping.

11. The substrate processing chamber of claim 1, wherein the contoured bottom surface of the lid plate and the gas distribution plate form the lower portion of the central channel.

12. The substrate processing chamber of claim 1, wherein each aperture of the plurality of apertures of the gas distribution plate comprises a through hole having an upper portion having a countersunk hole, a cylindrical center portion extending perpendicularly to an upper surface of the gas distribution plate, and a lower portion that tapers outwardly from a center of each aperture.

13. A substrate processing chamber, comprising:
a chamber body;
a chamber lid assembly having a housing enclosing a central channel that extends along a central axis and has an upper portion and a lower portion;
a lid plate coupled to the housing and having a contoured bottom surface that extends downwardly and outwardly from a central opening coupled to the lower portion of the central channel to a peripheral portion of the lid plate, the lid plate having one or more channels formed through the lid plate from a top surface of the lid plate to the contoured bottom surface;
a gas distribution plate disposed below the lid plate and having a plurality of apertures disposed through the gas distribution plate, wherein the contoured bottom surface of the lid plate completely encloses top openings of the plurality of apertures disposed through the gas distribution plate;
a remote plasma source fluidly coupled to the central channel;
an isolation collar coupled between the remote plasma source and the housing, wherein the isolation collar has an inner channel extending through the isolation collar to fluidly couple the remote plasma source and the central channel;
an exhaust conduit coupled to the isolation collar at a first end and to a main pumping channel at a second end; and
a valve coupled to the exhaust conduit to selectively open or close the exhaust conduit.

14. The substrate processing chamber of claim 13, wherein the housing includes an inner region; and further comprising:
an insert disposed in the inner region and having a central passageway that at least partially defines the central channel.

15. The substrate processing chamber of claim 14, further comprising:
a differential pumping line coupled to the insert at a first end and to the one or more channels formed through the lid plate at a second end,
wherein the one or more channels formed through the lid plate are disposed in an area of the lid plate between two or more o-rings to exhaust gases trapped between the o-rings.

16. The substrate processing chamber of claim 13, further comprising:
a heater plate coupled to an upper surface of the lid plate to heat the lid plate to a predetermined temperature.

17. The substrate processing chamber of claim 13, wherein a density of the plurality of apertures varies across the gas distribution plate.

18. The substrate processing chamber of claim 13, wherein the plurality of apertures have an equivalent fluid conductance.

19. The substrate processing chamber of claim 13, wherein the gas distribution plate is formed of a non-corrosive ceramic material.

20. The substrate processing chamber of claim 13, wherein the contoured bottom surface of the lid plate and the gas distribution plate form the lower portion of the central channel.

\* \* \* \* \*